(12) United States Patent
Cho et al.

(10) Patent No.: US 12,448,563 B2
(45) Date of Patent: Oct. 21, 2025

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Oul Cho, Suwon-si (KR); Kwanghee Kim, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 271 days.

(21) Appl. No.: 18/226,737

(22) Filed: Jul. 26, 2023

(65) Prior Publication Data

US 2023/0371297 A1 Nov. 16, 2023

Related U.S. Application Data

(62) Division of application No. 16/597,891, filed on Oct. 10, 2019, now Pat. No. 11,800,733.

(30) Foreign Application Priority Data

Oct. 12, 2018 (KR) ........................ 10-2018-0122139

(51) Int. Cl.
*C09K 11/02* (2006.01)
*C09K 11/54* (2006.01)
(Continued)

(52) U.S. Cl.
CPC ............ *C09K 11/025* (2013.01); *C09K 11/54* (2013.01); *C09K 11/61* (2013.01); *C09K 11/623* (2013.01);
(Continued)

(58) Field of Classification Search
CPC .......... G02F 1/133614; H10H 20/8512; H10F 77/1433; C09K 11/025; C09K 11/54;
(Continued)

(56) References Cited

U.S. PATENT DOCUMENTS 10,074,770 B2 9/2018 Park et al.
10,559,712 B2 2/2020 Park et al.
(Continued)

FOREIGN PATENT DOCUMENTS

CN 110176548 A 8/2019
KR 20130047943 A 5/2013
(Continued)

OTHER PUBLICATIONS

English Translation of Office Action dated Apr. 1, 2023 of the corresponding Korean Patent Application No. 10-2018-0122139, 8 pp.
(Continued)

*Primary Examiner* — Matthew E. Hoban
(74) *Attorney, Agent, or Firm* — CANTOR COLBURN LLP

(57) ABSTRACT

A light emitting device including a first electrode and a second electrode facing each other, a quantum dot emission film disposed between the first electrode and the second electrode, and a charge auxiliary layer disposed between the emission film and the first electrode, between the emission film and the second electrode, or between the emission film and the first electrode and between the emission film and the second electrode, wherein the quantum dot emission film includes a first surface facing the charge auxiliary layer and an opposite second surface. A manufacturing method of making the light emitting device, and a display device including the same.

19 Claims, 9 Drawing Sheets

(51) Int. Cl.
    *C09K 11/61*           (2006.01)
    *C09K 11/62*           (2006.01)
    *C09K 11/70*           (2006.01)
    *C09K 11/88*           (2006.01)
    *H10K 50/115*         (2023.01)
    *H10K 50/13*          (2023.01)
    *H10K 71/00*          (2023.01)
    *H10K 71/40*          (2023.01)
    *H10K 101/30*         (2023.01)

(52) U.S. Cl.
    CPC ............ *C09K 11/70* (2013.01); *C09K 11/883* (2013.01); *H10K 50/115* (2023.02); *H10K 50/13* (2023.02); *H10K 71/00* (2023.02); *H10K 71/40* (2023.02); *H10K 2101/30* (2023.02)

(58) Field of Classification Search
    CPC ....... C09K 11/61; C09K 11/623; C09K 11/70; C09K 11/88
    See application file for complete search history.

(56) References Cited

U.S. PATENT DOCUMENTS

| | | |
|---|---|---|
| 11,011,672 B2 | 5/2021 | Park et al. |
| 11,667,838 B2 | 6/2023 | Moriyama et al. |
| 2016/0233449 A1* | 8/2016 | Murayama ........... C09K 11/565 |
| 2018/0054872 A1 | 2/2018 | Xu et al. |
| 2018/0356070 A1* | 12/2018 | Miyanaga .......... H10H 20/8512 |
| 2019/0112527 A1* | 4/2019 | Moriyama ........... C09K 11/883 |

FOREIGN PATENT DOCUMENTS

| | | |
|---|---|---|
| KR | 101486533 B1 | 2/2015 |
| KR | 1020170074585 A | 6/2017 |
| WO | 2017188300 A1 | 11/2017 |

OTHER PUBLICATIONS

Eunjoo Jang, et al., "White-Light-Emitting Diodes with Quantum Dot Color Converters for Display Backlights", Adv. Mater. 2010, 22, 3076-3080.

Office Action dated Apr. 1, 2023 of the corresponding Korean Patent Application No. 10-2018-0122139, 7 pp.

Seth Coe, et al., "Electroluminescence from single monolayers of nanocrystals in molecular organic devices", Nature, vol. 420, Dec. 19/26, 2002, www.nature.com/nature, 800-803.

Tae-Ho Kim, et al., "Full-colour quantum dot displays fabricated by transfer printing", Nature Photonics, vol. 5, 176 Mar. 2011, www.nature.com/naturephotonics, 176-182.

Youhong Zeng, et al., "Excited Hole Photochemistry of CdSe/CdS Quantum Dots", 2016 American Chemical Society, 120, 17853-17862.

* cited by examiner

LIGHT EMITTING DEVICE AND DISPLAY DEVICE INCLUDING THE SAME

CROSS-REFERENCE TO RELATED APPLICATION

This divisional application claims priority to U.S. patent application Ser. No. 16/597,891, filed Oct. 10, 2019, now U.S. Pat. No. 11800733, issued Oct. 24, 2023, and Korean Patent Application No. 10-2018-0122139, filed on Oct. 12, 2018, and all benefits accruing therefrom under 35 U.S.C. §§ 119, 120, the entire contents of which are incorporated herein by reference.

BACKGROUND

1. Field

A light emitting device, a method of making the light emitting device, and a display device are disclosed.

2. Description of the Related Art

Physical characteristics (e.g., energy bandgaps, melting points, etc.) of nanoparticles known as intrinsic characteristics may be controlled by changing their particle sizes, unlike bulk materials. For example, semiconductor nanocrystals, also referred to as quantum dots, if activated with photoenergy or electrical energy may emit light in a wavelength corresponding to the particle size of the quantum dots. Accordingly, the quantum dots may be used as a light emitting elements to emit light of a predetermined wavelength.

SUMMARY

Recently, research on a light emitting device using the quantum dots as a light emitting element is being made. The quantum dots are different from conventional light emitting elements, and thus a new method of improving a performance of the light emitting device is desired.

An embodiment provides a light emitting device capable of exhibiting improved performance. An embodiment provides a method of making the light emitting device. An embodiment provides a display device including the light emitting device. An embodiment provides for a quantum dot emission film.

A light emitting device according to an embodiment includes a first electrode and a second electrode facing each other, a quantum dot emission film disposed between the first electrode and the second electrode, and a charge auxiliary layer disposed between the quantum dot emission film and the first electrode, between the quantum dot emission film and the second electrode, or between the quantum dot emission film and the first and the second electrodes, wherein the quantum dot emission film includes a first surface facing the charge auxiliary layer and an opposite second surface, the quantum dot emission film includes a first emission layer including first quantum dots that constitute at least a portion of the first surface, and a second emission layer including second quantum dots that constitute at least a portion of the second surface, the second emission layer disposed on the first emission layer, the first quantum dots and the second quantum dots do not include lead, and the first quantum dots and the second quantum dots comprise a halide on at least a portion of the surface of the quantum dots.

The first quantum dots and the second quantum dots may not include cadmium.

The first emission layer and the second emission layer may not be dissolved in a C1 to C10 alcohol solvent, cyclohexyl acetate, cyclohexane, C5 to C20 alkane, or a combination thereof.

An amount of the halide in the quantum dot emission film, as determined by an ion chromatography (IC) analysis, may be greater than or equal to about 0.01 parts per million (ppm) and less than or equal to about 0.5 ppm based on a light emitting surface of 1 square centimeter ($cm^2$).

The quantum dots may include zinc and selenium. A molar ratio of zinc relative to selenium in the emission film may be greater than or equal to about 1.88:1, as determined by inductively-coupled plasma (ICP) atomic absorption analysis.

The quantum dots may include zinc, and in the emission film a peak ratio of a halogen peak intensity to a zinc peak intensity may be greater than or equal to about 3 percent (%), for example, greater than or equal to about 4%, greater than or equal to about 5%, greater than or equal to about 6%, greater than or equal to about 7%, greater than or equal to about 8%, greater than or equal to about 9%, or greater than or equal to about 10%, as determined by X-ray photoelectron (XPS) spectroscopy.

The first quantum dots may not include an organic thiol compound on the surface of the first quantum dots.

The second quantum dots may not include an organic thiol compound on the surface of the second quantum dots.

The first quantum dots and the second quantum dots may emit the same color light.

The first quantum dots and the second quantum dots may emit different color light.

The first quantum dots and the second quantum dots may include a core and a shell disposed on the core.

The core may include a first semiconductor nanocrystal and the shell may include a second semiconductor nanocrystal having a different composition than the first semiconductor nanocrystal.

The first semiconductor nanocrystal and the second semiconductor nanocrystal may independently comprise a Group II-VI compound, a Group III-V compound, a Group IV-VI compound, a Group IV element or compound, a Group compound, a Group I-II-IV-VI compound, or a combination thereof.

The first semiconductor nanocrystal may include InP, InZnP, ZnSe, ZnSeTe, or a combination thereof.

The outermost layer of the shell may include zinc and sulfur.

The first quantum dots and the second quantum dots may further include an organic ligand on the surfaces of the first and the second quantum dots.

The organic ligand may include RCOOH, $RNH_2$, $R_2NH$, $R_3N$, $RH_2PO$, $R_2HPO$, $R_3PO$, $RH_2P$, $R_2HP$, $R_3P$, ROH, RCOOR, $RPO(OH)_2$, RHPOOH, RHPOOH, or a combination thereof, wherein R may be the same or different and may independently include a C1 to C40 substituted or unsubstituted aliphatic hydrocarbon, or a C6 to C20 substituted or unsubstituted aromatic hydrocarbon, or a combination thereof.

The organic ligand may include a C6 to C40 aliphatic carboxylic acid compound.

The quantum dot emission film may have a thickness of greater than or equal to about 10 nanometers (nm), for example, greater than or equal to about nm or greater than or equal to about 30 nm.

The quantum dot emission film may have a thickness of less than or equal to about 100 nm, for example, less than or equal to about 80 nm, or less than or equal to about 50 nm.

The first emission layer may have a thickness of greater than or equal to about 5 nm, for example, greater than or equal to about 10 nm.

The first emission layer may have a thickness of less than or equal to about 40 nm, for example, less than or equal to about 20 nm.

The second emission layer may have a thickness of greater than or equal to about 5 nm, for example, greater than or equal to about 10 nm.

The second emission layer may have a thickness of less than or equal to about 40 nm, for example, less than or equal to about 20 nm.

The quantum dot emission film may further include a third emission layer disposed between the first emission layer and the second emission layer. The third emission layer includes third quantum dots, wherein the third quantum dots may include a halide on the surfaces thereof.

The third quantum dots may emit the same color light as the first quantum dots and the second quantum dots.

The third quantum dots may emit a different color light from the first quantum dots and the second quantum dots.

The third emission layer may have a thickness of greater than or equal to about 5 nm, for example, greater than or equal to about 10 nm.

The third emission layer may have a thickness of less than or equal to about 40 nm, for example, less than or equal to about 20 nm.

The charge auxiliary layer of the light emitting device may include an electron auxiliary layer between the emission layer and the second electrode, wherein the electron auxiliary layer may include nanoparticles including a zinc metal oxide.

The zinc metal oxide may be represented by Chemical Formula 1

$Zn_{1-x}M_xO$

In Chemical Formula 1,

M is Mg, Ca, Zr, W, Li, Ti, Y, Al, or a combination thereof, and $0 \leq x \leq 0.5$.

The metal oxide may include a zinc oxide, a zinc magnesium oxide, or a combination thereof.

The nanoparticles may have an average particle size of greater than or equal to about 1 nm.

The nanoparticles may have an average particle size of less than or equal to about 10 nm.

A work function of the first electrode may be higher than a work function of the second electrode.

The first electrode may be an anode. The first electrode may include indium tin oxide.

The second electrode may be a cathode. The second electrode may include a conductive metal.

In an embodiment, a method of manufacturing the aforementioned light emitting device includes
  forming a quantum dot emission film on a first electrode, forming a charge auxiliary layer on the quantum dot emission film, and forming a second electrode on the charge auxiliary layer.

The forming of the quantum dot emission film includes:
  forming a first layer including a plurality of first quantum dots including a first organic ligand on the surfaces thereof;
  treating the first layer with a first halogen compound to replace at least a portion of the first organic ligand with a first halide;
  forming a second layer including a plurality of second quantum dots including a second organic ligand on the surfaces thereof, the second layer disposed on the treated first layer; and
  treating the second layer with a second halogen compound to replace at least a portion of the second organic ligand with a second halide that is the same or different than the first halide.

For obtaining the treated first layer, the processes of forming the first layer and replacing some of the organic ligand with a first halide may be repeated one or more times, for example, two times, three times, or more than three times.

For obtaining the treated second layer, the processes of forming the second layer and replacing some of the organic ligand with a halide may be repeated one or more times, for example, two times, three times, or more.

The treating of the first or second layer with the first or second halogen compound may include
  preparing an alcohol solution of the first or second halogen compound;
  contacting the first or second layer with the alcohol solution; and
  removing the alcohol solution from the first or second layer and drying the quantum dot layer.

The halogen compound may include a metal halide, an alkyl ammonium halide, or a combination thereof.

The halogen compound may include a fluoride, a chloride, a bromide, iodide, or a combination thereof.

The halogen compound may include zinc.

In the treating of the first or the second layer, the amount of decrease of the first or the second organic ligand on the first or the second layer, respectively, may be greater than or equal to about 20 percent (%)change in a characteristic peak intensity of a functional group of the first organic ligand, or a functional group of the second organic ligand, as determined by infrared spectroscopy.

In an embodiment, a display device includes the aforementioned light emitting device.

In an embodiment, an electroluminescent device having improved efficiency and life-span may be provided.

In an embodiment, a quantum dot emission film including a first surface and an opposite second surface. The quantum dot emission film includes a first emission layer including first quantum dots that constitute at least a portion of the first surface, and a second emission layer including second quantum dots that constitute at least a portion of the second surface. The first quantum dots and the second quantum dots do not include lead, and the first quantum dots and the second quantum dots include a halide on at least a portion of the surface of the quantum dots.

In an embodiment, the amount of the halide in the quantum dot emission film is greater than or equal to about 0.01 parts per million and less than or equal to about 0.5 parts per million based on a film emission surface of 1 square centimeter.

In an embodiment, the first quantum dots, and the second quantum dots, includes a core and a shell disposed on the core, In an embodiment, the core includes a first semiconductor nanocrystal, and the shell includes a second semiconductor nanocrystal having a different composition than the first semiconductor nanocrystal. The first semiconductor nanocrystal and the second semiconductor nanocrystal independently include a Group II-VI compound, a Group III-V compound, a Group IV-VI compound, a Group IV element or compound, a Group compound, a Group I-II-IV-VI compound, or a combination thereof.

In an embodiment, the first semiconductor nanocrystal comprises InP, InZnP, ZnSe, ZnSeTe, or a combination thereof, and an outermost layer of the shell comprises zinc and sulfur.

BRIEF DESCRIPTION OF THE DRAWINGS

These and/or other aspects will become apparent and more readily appreciated from the following description of embodiments, taken in conjunction with the accompanying drawings.

DETAILED DESCRIPTION

Figure 1:
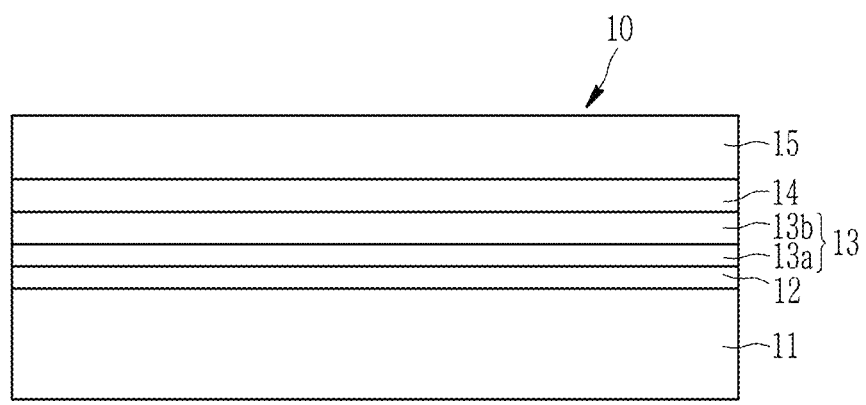
FIG. 1 is a schematic cross-sectional view of a quantum dot (QD) luminescent electronic device (LED) according to a non-limiting embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," "the," and "at least one" are intended to include the plural forms, including "at least one," unless the content clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a HOMO energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

As used herein, the term halide refers to the elements F, Cl, Br, or I, or a monoanion of the element F, Cl, Br, or I, each of which my optionally include a corresponding counter cation.

As used herein, "Group" refers to a group of Periodic Table.

As used herein, "Group II" refers to Group IIA and Group IIB, and examples of a Group II metal may be Cd, Zn, Hg, and Mg, but are not limited thereto.

As used herein, "Group III" refers to Group IIIA and Group IIIB, and examples of a Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples thereof may include Li, Na, K, Rb, and Cs, but are not limited thereto.

As used herein, "Group V" refers to Group VA, and examples thereof may include nitrogen, phosphorus, arsenic, antimony, and bismuth, but are not limited thereto.

As used herein, "Group VI" refers to Group VIA, and examples thereof may include sulfur, selenium, and tellurium, but are not limited thereto.

As used herein, when a definition is not otherwise provided, "substituted" may refer to replacement of hydrogen of a compound, a group, or a moiety by a substituent selected from a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenyl ester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, a hydrocarbon group may refer to a group including carbon and hydrogen (e.g., alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "alkyl" may refer to a linear or branched saturated monovalent hydrocarbon group (methyl, ethyl hexyl, etc.).

Herein, "alkenyl" may refer to a linear or branched monovalent hydrocarbon group having one or more carbon-carbon double bond.

Herein, "alkynyl" may refer to a linear or branched monovalent hydrocarbon group having one or more carbon-carbon triple bond.

Herein, "aryl" may refer to a group formed by removal of at least one hydrogen from an aromatic group (e.g., phenyl or naphthyl group).

Herein, "hetero" may refer to one including 1 to 3 heteroatoms of N, O, S, Si, P, or a combination thereof.

FIG. 1 is a schematic cross-sectional view of a light emitting device according to an embodiment.

Referring to FIG. 1, a light emitting device 10 according to an embodiment includes a first electrode 11 and a second electrode 15 facing each other, a quantum dot emission film 13 disposed between the first electrode 11 and the second electrode 15, and, charge auxiliary layers, e.g., a hole auxiliary layer 12 and an electron auxiliary layer 14, disposed between the quantum dot emission film 13 and the first electrode 11, and between the quantum dot emission film 13 and the second electrode 15, respectively. The quantum dot emission film 13 includes a first surface facing the hole auxiliary layer 12 and an opposite second surface. The quantum dot emission film 13 includes a first emission layer 13a including first quantum dots that constitute at least a portion of the first surface and a second emission layer 13b including second quantum dots that constitute at least a portion of the second surface. The second emission layer 13b disposed on the first emission layer 13a.

The first quantum dots and the second quantum dots do not include cadmium. The first quantum dots and the second quantum dots do not include lead. The first quantum dots and the second quantum dots do include a halide on at least a portion of the surface of the quantum dots.

The light emitting device may further include a substrate (not shown). The substrate may be disposed at the side of the first electrode 11 or the second electrode 15. In an embodiment, the substrate may be disposed at the side of the first electrode. The substrate may be a substrate including an insulation material (e.g., insulating transparent substrate). The substrate may include glass; various polymers such as polyesters (e.g., polyethylene terephthalate (PET), polyethylene naphthalate (PEN)), polycarbonate, polyacrylate, polyimide, and polyamideimide; polysiloxane (e.g. PDMS); inorganic materials such as Al$_2$O$_3$ and ZnO; or a combination thereof, but is not limited thereto. The substrate may be made of a silicon wafer. Herein "transparent" may refer to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material but is not particularly limited. The transparent substrate may have flexibility. The substrate may be omitted.

One of the first electrode 11 and the second electrode 15 may be an anode and the other may be a cathode. For example, the first electrode 11 may be an anode and the second electrode 15 may be a cathode.

The first electrode 11 may be made of a conductor, for example a metal, a conductive metal oxide, or a combination thereof. The first electrode 11 may be for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or SnO$_2$ and Sb, but is not limited thereto. In an embodiment, the first electrode may include a transparent conductive metal oxide, for example, indium tin oxide. A work function of the first electrode may be higher than a work function of the second electrode. A work function of the first electrode may be lower than a work function of the second electrode.

The second electrode 15 may be made of a conductor, for example a metal, a conductive metal oxide, a conductive polymer, or a combination thereof. The second electrode 15 may be for example a metal or an alloy thereof such as aluminum, magnesium, calcium, sodium, potassium, titanium, indium, yttrium, lithium, gadolinium, silver, gold, platinum, tin, lead, cesium, or barium; a multi-layer structured material such as LiF/Al, $Li_2$/Al, Liq/Al, LiF/Ca, or $BaF_2$/Ca, but is not limited thereto. The conductive metal oxide is the same as described above.

In an embodiment, a work function of the first electrode 11 may be, for example, about 4.5 eV to about 5.0 eV (e.g., about 4.6 eV to about 4.9 eV) and a work function of the second electrode 15 may be, for example, greater than or equal to about 4.0 eV and less than 4.5 eV (e.g., about 4.0 eV to about 4.3 eV). The work function of the first electrode may be greater than a work function of the second electrode. In another embodiment, the work function of the second electrode 15 may be, for example, about 4.5 eV to about 5.0 eV (e.g., about 4.6 eV to about 4.9 eV) and the work function of the first electrode 11 may be, for example, greater than or equal to about 4.0 eV and less than about 4.5 eV (e.g., about 4.0 eV to about 4.3 eV). The work function of the first electrode may be lower than a work function of the second electrode.

At least one of the first electrode 11 and the second electrode 15 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. If one of the first electrode 11 and the second electrode 15 is a non-light-transmitting electrode, the first or the second electrode may be, for example, an opaque conductor such as aluminum (Al), silver (Ag), gold (Au), or a combination thereof.

A thickness of the electrodes (the first electrode and/or the second electrode) is not particularly limited and may be appropriately selected considering device efficiency. For example, the thickness of the electrodes may be greater than or equal to about 5 nm, for example, greater than or equal to about 50 nm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The quantum dot emission film 13 includes a first surface facing the charge auxiliary layer and an opposite second surface. The quantum dot emission film 13 may have a multi-layer structure. The quantum dot emission film 13 includes a first emission layer including first quantum dots that constitute at least a portion of the first surface 13a, a second emission layer including second quantum dots that constitute at least a portion of the second surface. The second emission layer disposed on the first emission layer.

The quantum dots (e.g., first quantum dots and second quantum dots, hereinafter referred to as quantum dots) included in the quantum dot emission film do not include lead (and optionally cadmium, mercury, or both), but include halide (chloride, bromide, fluoride, iodide, or a combination thereof) on at least a portion of the surfaces of the quantum dots (e.g., bound to the surfaces). In an embodiment, the quantum dots may not include a heavy metal (e.g., cadmium, lead, mercury, or both).

As used herein, the terms "not include lead" or "not include cadmium" refers to not substantially including lead or cadmium, respectively. As understood by a person of ordinary skill, as specific metal compounds are manufactured and purified, the metal compounds may still contain trace contaminants of an undesired metal. As an example of this understanding, persons of skill recognize that zinc, selenium, or many metal compounds no matter how well purified by a commercial supplier will contain trace contaminants of other metals such as cadmium or lead. In accordance with this disclosure, the term "not include lead" or "not include cadmium" refers to an amount of lead or cadmium, respectively, of less than about 100 parts per million (ppm), less than about 50 ppm, less than about 30 ppm, less than about ppm, less than about 10 ppm, less than about 5 ppm, or even about 0 ppm.

Similarly, the term, "not including the heavy metal" may refer to "not substantially including the heavy metal," for example, may refer to include in an amount of less than about 100 ppm, less than about 50 ppm, less than about 30 ppm, less than about 20 ppm, less than about 10 ppm, less than about 5 ppm, or even about 0 ppm.

The quantum dots are nano-sized semiconductor nanocrystal particles and exhibit quantum confinement effects. The quantum dots may include a Group II-VI compound, a Group III-V compound, a Group IV-VI compound, a Group IV element or compound, a Group compound, a Group compound, a Group I-II-IV-VI compound, or a combination thereof.

The Group II-VI compound may include a binary element compound, for example, ZnS, ZnSe, ZnTe, ZnO, HgS, HgSe, HgTe, MgSe, MgS, or a mixture thereof; a ternary element compound, for example, ZnSeS, ZnSeTe, ZnSTe, HgSeS, HgSeTe, HgSTe, HgZnS, HgZnSe, HgZnTe, MgZnSe, MgZnS, or a mixture thereof; a quaternary element compound, such as, for example, HgZnTeS, HgZnSeS, HgZnSeTe, HgZnSTe, or a mixture thereof, or a mixture of any one or more compounds listed above. The Group II-VI compound may further include a Group III metal. The Group III-V compound may include a binary element compound, such as, for example, GaN, GaP, GaAs, GaSb, AlN, AlP, AlAs, AlSb, InN, InP, InAs, InSb, or a mixture thereof; a ternary element compound, for example, GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; a quaternary element compound, such as, for example, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a mixture thereof, or a mixture of one or more of the compounds listed above. The Group III-V compound may further include a Group II metal (e.g., InZnP). The IV-VI compound may include a binary element compound, such as, for example, SnS, SnSe, SnTe, or a mixture thereof; a ternary element compound, such as, for example, SnSeS, SnSeTe, SnSTe, or a mixture thereof; a quaternary element compound, or a mixture thereof. Examples of the Group compound may include $CuInSe_2$, $CuInS_2$, CuInGaSe, CuInGaS, or a mixture thereof, but is not limited thereto. Examples of the Group I-II-IV-VI compound may include CuZnSnSe, CuZnSnS, or a mixture thereof, but are not limited thereto. The Group IV element or compound may include a single element, such as, for example, Si, Ge, or a mixture thereof; a binary element compound, such as, for example, SiC, SiGe, or a mixture thereof, or a mixture of one or more compounds listed above.

The quantum dots may include a Group III-V compound-based semiconductor nanocrystal including indium and phosphorus. The Group III-V compound may further include zinc. The quantum dots may include a semiconductor nanocrystal including a Group II-VI compound including a chalcogen element (e.g., sulfur, selenium, tellurium, or a combination thereof) and zinc.

In the quantum dots, the aforementioned binary element compound, ternary element compound, and/or the quaternary element compound respectively exist in a uniform concentration in the semiconductor nanocrystal particles, or in partially different concentrations in the same particles. The semiconductor nanocrystals may have a core/shell structure, wherein a first semiconductor nanocrystal (core) is surrounded by another second semiconductor nanocrystal (shell) having the same or different composition. In an embodiment, the quantum dots may include a core including the aforementioned compounds (i.e., Group II-VI compound, Group III-V compound, Group IV-VI compound, Group IV element or compound, Group compound, Group compound, Group I-II-IV-VI compound, or a combination thereof) and a shell having a different composition from the core and including the aforementioned compounds. The core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having at least two layers. The shell may include Zn, Se, or optionally S (e.g., directly) on the core. The shell may include zinc and sulfur in the outermost layer.

The core and the shell may have an interface, and an element of the shell in the interface may have a concentration gradient, wherein the concentration of the element of the shell decreases toward the core. The semiconductor nanocrystal may have a structure including one semiconductor nanocrystal core and a multi-layered shell surrounding the core. Herein, the multi-layered shell has at least two layers wherein each layer may have a single composition, an alloy, or a concentration gradient.

In the quantum dots, the shell material and the core material may have different energy bandgaps from each other. For example, the energy bandgaps of the shell material may be greater than that of the core material. According to another embodiment, the energy bandgaps of the shell material may be less than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc, and a shell disposed on the core and including a second semiconductor nanocrystal including zinc and a chalcogen element. In another embodiment, the quantum dots may include a core including a first semiconductor nanocrystal including zinc, selenium, and optionally tellurium, and a shell disposed on the core and including a second semiconductor nanocrystal including zinc and a chalcogen element.

The quantum dots may have a particle size of greater than or equal to about 1 nm and less than or equal to about 100 nm. The quantum dots may have a particle size of about 1 nm to about 20 nm, such as, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm. The quantum dots may have a particle size of less than or equal to about 50 nm, less than or equal to about 40 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm. Shapes of the quantum dots are not particularly limited. For example, the shapes of the quantum dots may be a sphere, a polyhedron, a pyramid, a multipod, a square, a rectangular parallelepiped, a nanotube, a nanorod, a nanowire, a nanosheet, or a combination thereof, but is not limited thereto.

The aforementioned quantum dots may be commercially available or appropriately synthesized.

In the light emitting device according to an embodiment, the quantum dots may include an organic ligand (e.g., first organic ligand and second organic ligand that will be described later) on the surfaces of the quantum dots. The organic ligand may have a hydrophobic moiety. The organic ligand may be bound to the surface of the quantum dots. The first organic ligand may include RCOOH, $RNH_2$, $R_2NH$, $R_3N$, $R_3PO$, $R_3P$, ROH, RCOOR, $RPO(OH)_2$, RHPOOH, RHPOOH, or a combination thereof, wherein R is independently a C5 to C40 substituted or unsubstituted aliphatic hydrocarbon group such as a C3 to C40 alkyl or alkenyl, a C6 to C40 substituted or unsubstituted aromatic hydrocarbon group such as a C6 to C40 aryl group, or a combination thereof. The first quantum dots may include the same type of organic ligands as the second quantum dots. The first quantum dots may further include different organic ligands from the second quantum dots. Likewise, the second quantum dots may include the same type of organic ligands as the first quantum dots. The second quantum dots may further include different organic ligands from the first quantum dots. Alternatively, the organic ligands of the first quantum dots may be the same as the organic ligands of the second quantum dots. In other words, the first quantum dots may not include organic ligands except the organic ligands of the second quantum dots.

Examples of the organic ligand may be an amine such as methane amine, ethane amine, propane amine, butane amine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; a phosphine compound or an oxide compound thereof such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, or trioctyl phosphine oxide;

a diphenyl phosphine, a triphenyl phosphine compound, or an oxide compound thereof; C5 to C20 alkyl phosphonic acid such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dots may include a hydrophobic organic ligand alone or in a mixture of one or more. The organic ligand may include a C6 to C40 aliphatic carboxylic acid compound.

The charge auxiliary layer facing the first surface of the quantum dot emission film 13 may be a hole auxiliary layer 12 or an electron auxiliary layer 14. The opposite second surface of the quantum dot emission film 13 faces the electron auxiliary layer 14 or the hole auxiliary layer 12. The charge auxiliary layer may be the hole auxiliary layer 12. The first quantum dots included in the first emission layer (e.g., facing the hole auxiliary layer) and the second quantum dots included in the second emission layer (e.g., facing the electron auxiliary layer) include halide (e.g., chloride) (e.g., bound to metal ions of the surfaces of the quantum dots) on the surfaces of the quantum dots.

The quantum dots described herein may realize high color reproducibility and may have drawn attention as a next-generation display material in terms of forming an emission layer, in particular, forming an emission layer with a solution process. The quantum dots produced by colloidal synthesis may include organic ligands (e.g., organic compounds including long-chain aliphatic hydrocarbon and a functional group such as oleic acid (OA)) on their surfaces. In a QD device, injected charges form excitons (e-h pairs) in, at, or near the QD and emit light. Most or all of the organic ligands disposed on a surface of a QD for dispersibility thereof may have a relatively long chain length (e.g., C12). A particular concentration of organic ligands may be required to ensure solution-state dispersibility of the quantum dots in the emission layer. The bonding force between the organic ligands and cation or anion species present on the surface of a quantum dot (QD) may be relatively weak. In addition, a recombination zone in which electrons and holes are recombined may move during a long-term operation of a device, in particular a luminescent electronic device (LED).

Without being bound by any particular theory, when a charge imbalance occurs in the QD due to injection of charges into an LED, the QD may be charged and the ligand may desorb, which may lead to a reduction in life-span of the device. A device having a structure according to an embodiment may solve the aforementioned problems by strengthening an interaction between a halide and the surface of the quantum dots by a method described below. As a result, the quantum dot emission film to which the halide is bound may exhibit increased conductivity. Also, without being bound by any particular theory, in a device according to an embodiment (e.g., having the aforementioned structure by being manufactured by the method described below) it is possible to achieve uniform halide ligand substitution throughout a cross section of the quantum dot emission film, e.g., in a thickness direction of the emission film. The relatively high degree of uniformity achieved throughout a cross section of the emission film may further improve electroluminescence properties of the LED. This is because, in the device according to an embodiment, recombination of electrons/holes is more likely to occur in quantum dots having a halide on the surface of the quantum dots even if the electron/hole recombination zone moves with a long-time operation of the device.

The device according to an embodiment may exhibit increased halide ligand substitution rates, and thus, exhibit significantly higher hole conductivity (hole transport: HT).

The hole conductivity may be obtained from a current density graph of a suitable hole only device (hereinafter referred to as HOD) with respect to a voltage. A structure of the HOD for measuring hole transport capability may be an electrode/a lower hole auxiliary layer (a hole injection layer and/or a hole transport layer)/a quantum dot emission layer/an upper hole auxiliary layer (a hole injection layer and/or a hole transport layer)/an electrode (e.g., ITO/PEDOT: PSS/TFB/QD/GSH0137/HAT-CN/Ag). The hole conductivity may be a value at a predetermined voltage (e.g., 8 volts). For example, the HT measurement value may be measured by a predetermined number of cycles (e.g., three cycles) at a predetermined voltage interval (e.g., from −2 V to 8 V intervals) at a predetermined rate (e.g., 0.2 V unit). The HT value may be the one measured at a predetermined voltage (e.g., maximum voltage, for example, 8 V) at the first or third measurement.

Through utilization of a spin dry treatment, an HT value of an emission film in the device according to an embodiment may be increased at least two times, for example at least five times, at least seven times, at least ten times, at least 100 times, at least 200 times, at least 300 times, at least 400 times, or even 500 times as compared with a device that is made in the absence of a spin dry treatment. The emission film according to an embodiment has an increased halide content, which may increase HT.

The halide-bound quantum dots have significantly reduced dispersion and dissolution in a medium compared with quantum dots passivated with organic ligands. Accordingly, in a device according to an embodiment, the first emission layer and the second emission layer may not dissolve a C1 to C10 alcohol solvent (e.g., methanol, ethanol, propanol, isopropanol, butanol, pentenol), cyclohexyl acetate, C5 to C20 alkane (hexane, heptane, etc.), cyclohexane, or a combination thereof.

An amount of the halide in the quantum dot emission film (e.g., confirmed by an ion chromatography analysis) may be greater than or equal to about 0.01 ppm, greater than or equal to about 0.02 ppm, greater than or equal to about 0.03 ppm, greater than or equal to about 0.04 ppm, greater than or equal to about 0.05 ppm, greater than or equal to about 0.06 ppm, greater than or equal to about 0.07 ppm, greater than or equal to about 0.08 ppm, greater than or equal to about 0.09 ppm, or greater than or equal to about 1 ppm. The amount of the halide in the quantum dot emission film may be less than or equal to about 0.5 ppm, less than or equal to about 0.045 ppm, less than or equal to about 0.04 ppm, less than or equal to about 0.035 ppm, or less than or equal to about 0.03 ppm, based on a light emitting surface of 1 square centimeter ($cm^2$).

The first quantum dots and/or the second quantum dots may not include an organic thiol compound (e.g., an organic thiol compound represented by Chemical Formula 2) on the surfaces:

[Chemical Formula 2]

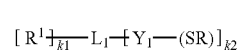

Herein, $R^1$ is hydrogen; a substituted or unsubstituted C1 to C40 (or C1 to C30) linear or branched alkyl group; a C1 to C40 (or C1 to C30) linear or branched alkenyl group, a substituted or unsubstituted C6 to C30 aryl group; a substituted or unsubstituted C7 to C30 arylalkyl group; a substituted or unsubstituted C3 to C30 heteroaryl group; a substituted or unsubstituted C4 to C30 heteroarylalkyl group; a substituted or unsubstituted C3 to C30 cycloalkyl group; a substituted or unsubstituted C2 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group but are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RO(=O)X, wherein R is a substituted or unsubstituted alkylene group and X is a halogen); —O(=O)OR' (wherein R' is hydrogen or a C1 to C20 linear or branched alkyl group); —ON; —O(=O)NRR', —O(=O)ONRR' (wherein R and R' are independently hydrogen or a C1 to C20 linear or branched alkyl group), or a combination thereof, $L_1$ is a carbon atom, a nitrogen atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C2 to C30 heterocycloalkylene group, a substituted or unsubstituted C6 to C30 arylene group, or a substituted or unsubstituted C3 to C30 heteroarylene group, or a substituted or unsubstituted C2 to C30 alkylene group or a substituted or unsubstituted C3 to C30 alkenylene group wherein at least one methylene (—$CH_2$—) is replaced by sulfonyl (—$SO_2$—), carbonyl (CO), ether (—O—), sulfide (—S—), sulfoxide (—SO—), ester (—O(=O)O—), or amide (—C(=O)NR—) (wherein R is hydrogen or a C1 to C10 alkyl group), or a combination thereof.

$Y_1$ is a direct bond; —O(=S)—; a substituted or unsubstituted C1 to C30 alkylene group; a substituted or unsubstituted C2 to C30 alkenylene group; or a C2 to C30 alkylene group or a C3 to C30 alkenylene group, or a combination thereof wherein at least one methylene (—$CH_2$—) is replaced by sulfonyl (—$S(=O)_2$—), carbonyl (—O(=O)—), ether (—O—), sulfide (—S—), sulfoxide (—S(=O)—), ester (—C(=O)O—), amide (—O(=O)NR—) (wherein R is hydrogen or a C1 to C10 linear or branched alkyl group), imine (—NR—) (wherein R is hydrogen or a C1 to C10 linear or branched alkyl group), or a combination thereof.

R is hydrogen or a monovalent metal (e.g., an alkali metal, such as, Li, Na, or K), k1 is an integer of 0 or 1 or more, k2 is 1 or 2, when k2 is 2, $Y_1$ is a direct bond and two SR moieties are independently bound to the adjacent two carbon atoms in each $L_1$ moiety, and the sum of k1 and k2 does not exceed the valence of Li.

The first quantum dots and the second quantum dots may emit the same color light. As used herein, the light emission of the same color may mean a difference between maximum photoluminescence peak wavelengths of less than or equal to about 20 nm, for example, less than or equal to about 15 nm, less than or equal to about 10 nm, less than or equal to about 9 nm, less than or equal to about 8 nm, less than or equal to about 7 nm, less than or equal to about 6 nm, or less than or equal to about 5 nm. The first quantum dots and the second quantum dots may emit a different color light from each other. For example, the first quantum dots may emit red light and the second quantum dots may emit green light, or vice versa. The color emitted from the light emitting device may be controlled by the emitted colors of the quantum dots included in each quantum dot emission layer and the thickness of each emission layer, e.g. the first or the second, or optionally, a third emission layer. Thus, the device according to an embodiment offers a wide range of colors, for example, in the visible region of the spectrum. For example, examples of the colors that the device according to an embodiment may implement may include cyan, magenta, yellow, or white colors, as well as red, green, or blue.

The first and second quantum dots may allow design control of an absorption/photoluminescence wavelength by adjusting composition and/or particle size of the quantum dots. A maximum photoluminescence peak wavelength of the quantum dots may extend from the ultraviolet (UV) to infrared wavelengths or a wavelength of greater than the above wavelength range. For example, the maximum photoluminescence peak wavelength of the quantum dots may be greater than or equal to about, 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum photoluminescence wavelength of the quantum dots may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum photoluminescence wavelength of the quantum dots may be in the range of about 500 nm to about 650 nm. In the case of emitting green light, the maximum photoluminescence wavelength of the quantum dots may be in the range of about 500 nm to about 550 nm. In the case of emitting red light, the maximum photoluminescence wavelength of the quantum dots may be in the range of about 600 nm to about 640 nm. In the case of emitting blue light, the maximum photoluminescence wavelength of the quantum dots may be in the range of about 430 nm to about 480 nm.

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a relatively narrow photoluminescence spectrum. A (electro- or photo-) luminescence spectrum of the quantum dots may have, for example, a full width at half maximum (FWHM) of less than or equal to about 50 nm, for example less than or equal to about 45 nm, less than or equal to about 40 nm, less than or equal to about 35 nm, or less than or equal to about 30 nm.

The quantum dot emission film 13 may have a thickness of greater than or equal to about 10 nm, for example, greater than or equal to about 15 nm, greater than or equal to about 20 nm, or greater than or equal to about 30 nm. The quantum dot emission film 13 may have a thickness less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The quantum dot emission film 13 may have a thickness of, for example, about 10 nm to about 150 nm, for example about 15 nm to about 100 nm, for example about 15 nm to about 60 nm, or about 20 nm to about 50 nm.

The first emission layer 13a and the second emission layer 13b may have each thickness of greater than or equal to about 5 nm, for example, greater than or equal to about 10 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, or greater than or equal to about 25 nm. The first emission layer may have a thickness of less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 24 nm, less than or equal to about 26 nm, less than or equal to about 25 nm, less than or equal to about 24 nm, less than or equal to about 23 nm, less than or equal to about 22 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, or less than or equal to about 11 nm. In an embodiment, the first emission layer may have a thickness of 1 monolayer (ML) or more of a quantum dot, for example, 1.5 ML or more, 2 ML or more. The first emission layer may have a thickness of 10 ML or less, 9 ML or less, 8 ML or less, 7 ML or less, 6 ML or less, 5 ML or less, 4 ML or less, or 3 ML or less of a quantum dot, but is not limited thereto. The first and second emission layers may have the same thickness or different thicknesses.

The quantum dot emission film may further include a third emission layer including third quantum dots, which is disposed between the first emission layer and the second emission layer. The third quantum dots may include a halide on the surfaces thereof.

The third quantum dots may emit the same color light as the first quantum dots and the second quantum dots.

The third quantum dots may emit a different color light from the first quantum dots and the second quantum dots. The descriptions of the third quantum dots (e.g., compositions, sizes, wavelengths, and properties) are the same as described above with respect to the first and second quantum dots. Third quantum dots may emit the same color light as the first quantum dots and the second quantum dots. Alternatively, the third quantum dots may emit a different color light from at least one of the first quantum dots and the second quantum dots.

A thickness of the third emission layer may be appropriately selected and is not particularly limited. Details for the thickness of the third emission layer are the same as described above with respect to the first and second emission layers.

The quantum dot emission film 13 (e.g., the first emission layer and/or the second emission layer) may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The quantum dot emission film 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the quantum dot emission film 13 may have a HOMO energy level of about 5.6 eV to about 6.1 eV.

The quantum dot emission film 13 (e.g., the first emission layer and/or the second emission layer) may have for example an LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The quantum dot emission film 13 may have an LUMO energy level of greater than or equal to about 2.5 eV, for example, greater than or equal to about 2.6 eV, greater than or equal to about 2.7 eV, or greater than or equal to about 2.8 eV. In an embodiment, the quantum dot emission film 13 may have an energy bandgap of about 2.4 eV to about 3.5 eV.

The light emitting device according to an embodiment may include a charge auxiliary layer. The charge auxiliary layer may include an electron auxiliary layer and/or a hole auxiliary layer.

The hole auxiliary layer 12 may be disposed between the first electrode 11 (e.g., anode) and the quantum dot emission film 13. The hole auxiliary layer 12 may have one layer or two or more layers and may include, for example a hole injection layer, a hole transport layer, and/or an electron blocking layer.

The HOMO energy level of the hole auxiliary layer 12 may be adjusted to match the HOMO energy level of the quantum dot emission film 13, and mobility of holes from the hole auxiliary layer 12 into the quantum dot emission film 13 may be fortified.

The HOMO energy level of the hole auxiliary layer (e.g., the hole transport layer) 12 adjacent to the emission layer may be the same as the HOMO energy level of the quantum dot emission film 13, or may be less than that of the HOMO energy level of the quantum dot emission film 13, e.g., within about 1.0 eV or less. For example, a difference between the HOMO energy levels of the hole auxiliary layer 12 and the quantum dot emission film 13 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the hole auxiliary layer 12 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the hole auxiliary layer 12 may include a hole injection layer near to the first electrode 11 and a hole transport layer near to the quantum dot emission film 13. Herein, the HOMO energy level of the hole injection layer may be about 5.0 eV to about 6.0 eV, about 5.0 eV to about 5.5 eV, or about 5.0 eV to about 5.4 eV, and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

A material of the hole auxiliary layer 12 is not particularly limited and may be, for example, a fluorine-arylamine copolymer, such as, poly(9,9-dioctyl-fluorene-co-N-(4-butylphenyl)-diphenylamine) (TFB), a polymer or a copolymer including a substituted or unsubstituted fluorene moiety, polyarylamine, poly(N-vinylcarbazole, poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis(di-4-tolylamino)phenylcyclohexane (TAPC), p-type metal oxide (e.g., NiO, $WO_3$, $MoO_3$, etc.), a carbon-based material, such as, graphene oxide, and a combination thereof, but is not limited thereto.

In the hole auxiliary layer(s), a thickness of each layer may be appropriately selected. For example, each layer may have a thickness of greater than or equal to about 10 nm, for example, greater than or equal to about 15 nm, or greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 is disposed between the quantum dot emission film 13 and the second electrode 15 (e.g., the cathode). The electron auxiliary layer 14 may include, for example, an electron injection layer, an electron transport layer, and/or a hole blocking layer, but is not limited thereto. In an embodiment, the electron auxiliary layer 14 may include an electron transport layer.

The electron transport layer and/or the electron injection layer may include, for example, at least one of 1,4,5,8-naphthalene-tetracarboxylic dianhydride (NTCDA), bathocuproine (BCP), tris[3-(3-pyridyl)-mesityl]borane (3TP-YMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), and a combination thereof, but is not limited thereto. The hole blocking layer may include, for example, at least one of 1,4,5,8-naphthalene-tetracarboxylic dianhydride (NTCDA), bathocuproine (BCP), tris[3-(3-pyridyl)-mesityl]borane (3TP-YMB), LiF, $Alq_3$, $Gaq_3$, $Inq_3$, $Znq_2$, $Zn(BTZ)_2$, $BeBq_2$, and a combination thereof, but is not limited thereto.

In an embodiment, the electron auxiliary layer 14 (e.g., electron transport layer) includes a plurality of nanoparticles. The nanoparticles include metal oxide including zinc.

The metal oxide may include $Zn_{1-x}W_xO$ (Chemical Formula 1, wherein, M is Mg, Ca, Zr, W, Li, Ti, or a combination thereof and $0 \leq x \leq 0.5$). In an embodiment, in Chemical Formula 1, M may be magnesium (Mg). In an embodiment, in Chemical Formula 1, x may be greater than or equal to about 0.01, and less than or equal to about 0.3, for example, less than or equal to about 0.25, less than or equal to about 0.2, or less than or equal to about 0.15.

The metal oxide may include zinc oxide, zinc magnesium oxide, or a combination thereof. A LUMO absolute value of the quantum dots in the emission layer may be smaller than a LUMO absolute value of the metal oxide.

In another embodiment, a LUMO absolute value of the quantum dots in the emission layer may be larger than a LUMO absolute value of the metal oxide ETL. A LUMO absolute value of a blue QD may be smaller than a LUMO absolute value of the metal oxide ETL. Electron injection in an electroluminescent device including a blue QD may be different from that in an electroluminescent device including a red or green quantum dot.

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm. The average size of the nanoparticles may be less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, each thickness of the electron auxiliary layer 14 (e.g., an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm. The thickness of the electron auxiliary layer 14 (e.g., an electron injection layer, an electron transport layer, or a hole blocking layer) may be less than or equal to about 120 nm, less than or equal to about 110 nm, and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
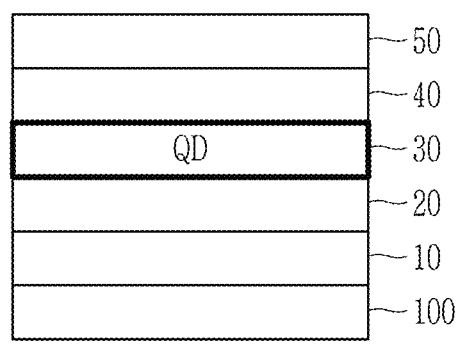
FIG. 2 is a schematic cross-sectional view of a QD LED according to another non-limiting embodiment.

Referring to FIG. 2, in an embodiment of the device, an anode 10 disposed on a transparent substrate 100 may include a metal oxide-based transparent electrode (e.g., ITO electrode) and a cathode 50 facing the anode may include a conductive metal (Mg, Al etc.) (e.g., having a relatively low work function). A hole auxiliary layer 20 (e.g., a hole injection layer of PEDOT:PSS and/or p-type metal oxide, and the like and/or a hole transport layer of TFB and/or PVK) may be disposed between the transparent electrode and the quantum dot emission film 30. The hole injection layer may be near to the transparent electrode and the hole transport layer may be near to the emission layer. Electron auxiliary layer 40 (e.g., an electron injection layer/transport layer) may be disposed between the quantum dot emission film and the cathode 50.

Figure 3:
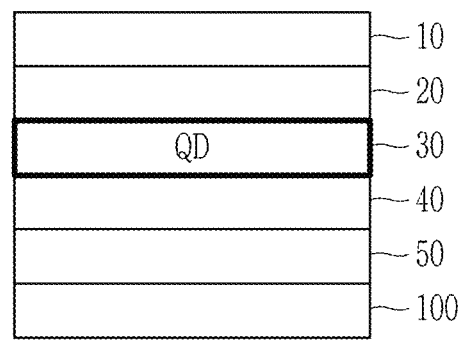
FIG. 3 is a schematic cross-sectional view of a QD LED according to another non-limiting embodiment.

A device according to another embodiment may have an inverted structure. Referring to FIG. 3, a cathode 50 disposed on the transparent substrate 100 may include a metal oxide-based transparent electrode (e.g., ITO), and an anode 10 facing the cathode may include a metal (Au, Ag, etc.) (e.g., having a relatively high work function). For example, (optionally doped) n-type metal oxide (crystalline Zn metal oxide) may be disposed between the transparent electrode 50 and the emission layer 30 as an electron auxiliary layer (e.g., electron transport layer) 40. $MoO_3$ or other p-type metal oxides may be disposed between the metal anode 10 and the quantum dot emission film 30 as a hole auxiliary layer 20 (e.g., a hole transport layer including TFB and/or PVK, and/or a hole injection layer including $MoO_3$ or another p-type metal oxide).

Another embodiment provides a method of manufacturing the aforementioned light emitting device. The manufacturing method includes forming a quantum dot emission film on a first electrode; forming a charge auxiliary layer on the quantum dot emission film; and forming a second electrode on the charge auxiliary layer, wherein the forming of the quantum dot emission film includes forming a quantum dot layer including a plurality of first quantum dots including a first organic ligand on the surfaces thereof;

treating the formed quantum dot layer with a halogen compound and replacing at least a portion of the first organic ligand with a halide to form a first layer;

forming a quantum dot layer including a plurality of second quantum dots including a second organic ligand on the surfaces thereof on the treated first layer; and treating the quantum dot layer with a halogen compound and replacing at least a portion of the second organic ligand with a halide to form a second layer.

The method may further include forming a charge auxiliary layer (e.g., hole auxiliary layer) on the first electrode before forming the emission layer on the first electrode. In this case, the emission layer may be formed on the charge auxiliary layer disposed on the first electrode.

The first electrode, the emission layer (the quantum dot emission film), the charge auxiliary layer, and the second electrode are the same as described above. The first electrode, the charge auxiliary layer, and the second electrode may be formed by an appropriate method (deposition, coating, etc.) depending on types of materials/thickness thereof.

The forming of the emission layer may be performed by dispersing quantum dots (including first or second organic ligands on the surfaces) in a solvent (e.g., organic solvent) to obtain quantum dot dispersion, and applying or depositing it on the substrate or the charge auxiliary layer in an appropriate manner (e.g., spin coating, inkjet printing, etc.). The organic solvent is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof. After forming the quantum dot layer, the layer may be heated in order to remove the solvent.

When forming the quantum dot layer, the first layer, and the second layer, a target thickness may be appropriately selected. If a spin dry (SD) process is performed a plurality of times, a thickness of a resultant film may not be the same as obtained by multiplying a target thickness and the number of processes. For example, if the target thickness is 11 nm, even if the process is repeated three times, the final thickness may not be 33 nm, and may be larger or smaller than that value. In forming the emission film, packing of quantum dots may not be uniform, and the quantum dots may have a sphere or tetra pot shape, so that particles may be located at a lower position of a curved surface after the primary coating. For example, in the case of two coatings and SD treatment with a target thickness of 1 ML, a final thickness may be 1.5 ML.

Figure 4:
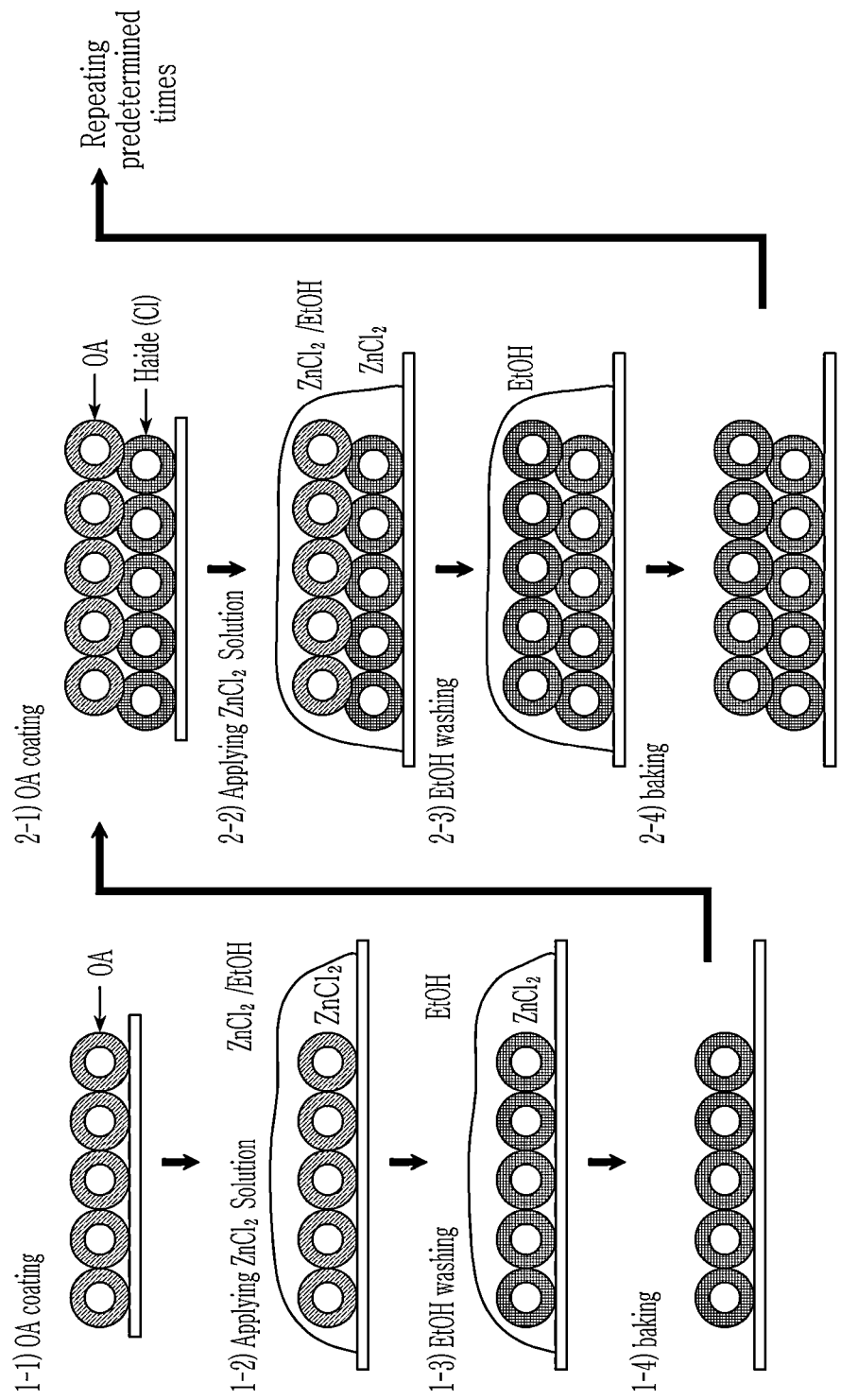
FIG. 4 is a schematic view showing a method of manufacturing a light emitting device according to a non-limiting embodiment.

The method according to an embodiment is schematically shown in FIG. 4. In the method according to an embodiment, a quantum dot emission film including quantum dots including a halide on the surfaces thereof and having a required final thickness is obtained not by forming it at a time but by forming/treating layers at a predetermined thickness (e.g., at least two layers, at least three layers, at least four layers, or at least five layers). Compared with the case where the quantum dots substituted with an organic ligand are formed into a film having a predetermined thickness at a time and subjected to a halide exchange treatment, the aforementioned method may ensure halide exchange treatment to the inside of the whole emission film.

In general, it is not easy to form a thin film by coating dispersion of quantum dots including the same type of organic ligand in plural times. The reason is that a solvent in the quantum dot dispersion dissolves a previously coated QD layer. For example, the dispersion of quantum dots including the same type of organic ligand may not be used to form a quantum dot emission film having a desired thickness in plural times.

In a method according to an embodiment, solubility/dispersibility of the quantum dots in the layer treated with the halide exchange treatment is significantly changed, and thus, the layer of quantum dots treated with the halide exchange treatment is not dissolved by dispersion of quantum dots including the same type of organic ligand. In other words, since the formed first layer is subjected to halide treatment to change the polarity (for example, from hydrophobic to hydrophilic), even if the quantum dot dispersion used for forming the first layer is applied to the halide-treated first layer, quantum dots included in the first layer may not be dissolved. Thus, an emission film having a desired thickness may be formed through a multilayer process. See, FIG. 4.

The treating of the first layer or the second layer with the halogen compound may include preparing an alcohol solution of the halogen compound; contacting the first layer or the second layer with the alcohol solution; and removing the alcohol solution from the first layer or the second layer (e.g., by using a spin coater) and drying (or baking) the first layer or the second layer.

The halogen compound may include a metal halide, a C1 to C20 alkylammonium halide, or a combination thereof. The metal halide may include zinc, lithium, sodium, or the like. The metal halide may include fluoride, chloride, bromide, iodide, or a combination thereof. In an embodiment, the metal halide may include zinc chloride, zinc bromide, zinc iodide, lithium chloride, sodium chloride, or a combination thereof.

The preparing of the alcohol solution of the aforementioned halogen compound may include dissolving the halogen compound in an alcohol solvent (e.g., C1 to C10 alcohol, for example, methanol, ethanol, propanol, isopropanol, butanol, pentenol, hexanol, heptanol, etc.). A concentration of the halogen compound in the alcohol solution may be greater than or equal to about 0.001 grams per Liter (g/L), for example, greater than or equal to about 0.01 g/L, greater than or equal to about 0.1 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L. The concentration of the halogen compound in the alcohol solution may be less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

The contacting of the first layer (or the second layer) with the alcohol solution may include adding the alcohol solution to the first layer (or the second layer) in a dropwise fashion and/or spin coating it after adding it in a dropwise fashion. The adding in a dropwise fashion and spin coating may be performed at least once, for example, at least two times, at least three times, at least four times, or more than four times.

The removing of the alcohol solution from first layer (or the second layer) may include washing (e.g., adding in a dropwise fashion and spin coating) the first layer (or the second layer) with an alcohol solvent. The washing may be performed at least once, for example, at least two times, at least three times, or more than three times.

The drying (or baking) of the first layer (or the second layer) from which the alcohol solution is removed may include heating the first layer (or the second layer) at a predetermined temperature.

The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C. The heating temperature may be about 70° C. to about 150° C.

The first layer may exhibit changed solubility through a ligand removal treatment. The quantum dot dispersion may be applied or deposited on the first layer which is subjected to the ligand removal treatment, to form the second layer. On the formed second layer, a charge auxiliary layer and an electrode may be optionally formed. The charge auxiliary layer (e.g., electron auxiliary layer) may be formed in an appropriate method by considering a material, a thickness, and the like of the electron auxiliary layer.

Because the formed second layer may not be dissolved in an alcohol solvent, if an electron transport layer is formed based on the aforementioned zinc-containing metal oxide nanoparticles, nanoparticles dispersed in the alcohol solvent may be formed on the aforementioned emission layer.

Another embodiment provides an electronic device including the aforementioned light emitting device. The electronic device may be applied to various electronic devices such as display devices or lighting devices.

Hereinafter, the embodiments are illustrated in more detail with reference to examples. However, these examples are exemplary, and the present scope is not limited thereto.

EXAMPLES

Analysis Methods

[1] Photoluminescence Analysis Photoluminescence (PL) spectra are obtained using a Hitachi F-7000 spectrometer at an irradiation wavelength of 372 nm.

[2] UV Spectroscopy
UV-Visible absorption spectra are obtained using a Hitachi U-3310 spectrometer.

[3] TEM-EDX Analysis
Transmission electron microscope energy dispersive spectroscopy is performed using UT F30 Tecnai electron microscope. TEM-EDX is used to measure average particle size of quantum dots and nanoparticles.

[4] X-ray Diffraction Analysis
XRD analysis is performed using a Philips XPert PRO equipment with a power of 3 kW.

[5] Electroluminescence Spectroscopy
A current depending on a voltage is measured using a Keithley 2635B source meter while applying a voltage, and electroluminescence is measured using a CS2000 spectrometer.

[6] Infrared Spectroscopy:
Infrared spectroscopy is performed using a Varian 670-IR with Miracle accessory.

[7] XPS Analysis
X-ray photoelectron spectroscopy is performed using an X-ray photoelectron spectrometer.

[8] ICP Analysis
Inductively-coupled plasma atomic emission spectroscopy (ICP-AES) analysis is performed using Shimadzu ICPS-8100.

[9] Ion Chromatography Analysis
Samples are dissolved in a $MeOH:CHCl_3=1:2$ solution, an acid solution is added to obtain a separated aqueous solution layer, and performing a Cl (chlorine) quantitative analysis of the obtained aqueous solution layer is determined with an ion chromatography method.

Synthesis of Quantum Dot

Reference Example 1-1: Preparation of Blue Light Emitting Quantum Dot (1) Selenium (Se) and tellurium (Te) are dispersed in trioctylphosphine (TOP) to obtain a Se/TOP stock solution and Te/TOP stock solution, respectively. 0.125 (millimoles) mmol of zinc acetate is added along with oleic acid to a reactor including trioctylamine and vacuum-treated at 120° C. After 1 hour, nitrogen is introduced into the reactor.

The reactor under nitrogen is heated to 300° C., and the prepared Se/TOP stock solution and the prepared Te/TOP stock solution are rapidly injected into the reactor in a Te/Se molar ratio of 1/25. When the reaction is complete, the reaction solution is rapidly cooled to room temperature, and acetone is added to obtain a precipitate. The precipitate is separated by centrifugation and is dispersed in toluene to obtain a ZnTeSe quantum dot dispersion in toluene.

(2) 1.8 mmol, 0.336 grams (g), of zinc acetate is added along with oleic acid to a flask including trioctylamine and vacuum-treated at 120° C. for 10 minutes. Nitrogen ($N_2$) is introduced into the flask and the temperature is increased to 180° C. The ZnTeSe core obtained in step (1) above is added and the Se/TOP and the S/TOP stock solutions are injected. The reaction temperature is set to be about 280° C. After the reaction is complete, the reactor is cooled to about room temperature, and ethanol is added. The prepared nanocrystals are centrifuged and dispersed in toluene to obtain a ZnTeSe/ZnSeS core/shell quantum dot dispersion in toluene. Photoluminescence peak wavelength: 450-465 nm Reference Example 1-2: Preparation of Red and Green Light Emitting Quantum Dot (1) 0.2 mmol of indium acetate (and 0.2 mmol of zinc acetate in the case of the green light emitting quantum dot) is dissolved along with palmitic acid in 300 mL of 1-octadecene in a reaction flask and heated at 120° C. under vacuum. After 1 hour, nitrogen is introduced into the reaction flask, and the temperature is increased to 280° C. A mixed solution of tris(trimethylsilyl)phosphine (TMS3P) in trioctylphosphine is rapidly injected and reacted for 30 minutes. The reaction solution is rapidly cooled to room temperature and acetone is added to form a precipitate. The precipitate is separated by centrifugation and then dispersed in toluene.

A Se powder and a S powder are dissolved in TOP to prepare a Se/TOP stock solution and an S/TOP stock solution, respectively.

Zinc acetate and oleic acid are dissolved in trioctylamine in a 300 mL reaction flask and vacuum-treated at 120° C. for 10 minutes. The atmosphere in the flask is substituted with nitrogen ($N_2$) and then heated at 180° C.

For red quantum dots, the above described InP core is added, (for green quantum dots, the above described InZnP core is added), and a predetermined amount of the Se/TOP stock solution and a predetermined amount of the S/TOP are added, and a reaction is performed at a reaction temperature of 280° C. for 60 minutes.

After cooling to about room temperature, an excessive amount of ethanol is added to the reaction flask and the mixtures is centrifuged. After the centrifugation the supernatant is discarded, the precipitate is dried and then dispersed in chloroform or toluene to provide a quantum dot solution (hereinafter, QD solution). A UV-vis absorption spectrum of the obtained QD solution is obtained. The obtained quantum dots emit red light or green light.

Synthesis of Metal Oxide Nanoparticles

Reference Example 2: Synthesis of Zn Metal Oxide Nanoparticles

Zinc acetate dihydrate and magnesium acetate tetrahydrate are added to dimethyl sulfoxide in a reactor so that a molar ratio of the following chemical formula, $Zn_{1-x}Mg_xO$, is provided, and the reactor is heated at 60° C. in air. Subsequently, an ethanol solution of tetramethyl ammonium hydroxide pentahydrate is added in a dropwise fashion thereto at a rate of 3 milliliters per minute (mL/min). The obtained mixture is stirred for one hour, and the $Zn_{1-x}Mg_xO$ nanoparticles produced therein are centrifuged and dispersed in ethanol to obtain an ethanol dispersion of $Zn_xMg_{1-x}O$ nanoparticles, (x is greater than 0 and less than or equal to 0.5).

X-ray diffraction analysis of the obtained $Zn_xMg_{1-x}O$ nanoparticles is used to confirm that ZnO crystals are formed. A transmission electron microscopic analysis is also performed for the obtained nanoparticles, and the results show that the particles have an average particle size of about 3 nm.

Energy bandgaps of the obtained nanoparticles are measured by a UV band edge tangent line (UV-2600, SHIMADZU). The results show that the synthesized $Zn_{1-x}Mg_xO$ nanoparticles have an energy bandgap of about 3.52 eV to 3.70 eV.

Spin-dry Treatment

Reference Example 3-1

A quantum dot emission film having a thickness of 27 nm is formed by spin-coating an octane dispersion of the core/shell quantum dots according to Reference Example 1 on a silicon substrate, followed by heat-treating the coating at 80° C. for 30 minutes. An infrared spectrum of the obtained quantum dot emission film is performed to measure a COO— peak intensity relative to a Si peak, and the result is shown in Table 1 and FIG. 5.

Reference Example 3-2

The octane dispersion of core/shell quantum dots (100 to 200 microliters (ul)) according to Reference Example 1 is spin-coated on a silicon substrate and heat-treated at 80° C. for 30 minutes to form a single layer having a target thickness of 12 nm. On this first layer, a treatment solution obtained by dissolving zinc chloride in ethanol (a concentration: 100 g/L) is added in a dropwise fashion, allowed to stand, partially removed by using a spin coater, and then, several times washed with ethanol. The washed first layer is dried on an 80° C. hot plate. The halide-surface treated (hereinafter, referred to as "spin-dry treated") first layer is once more spin-dried (i.e., treated with the zinc chloride solution, allowed to stand, and dried on an 80° C. hot plate at as above) to obtain a quantum dot emission film having an entire thickness of greater than or equal to 21 nm. An infrared spectrum of the obtained quantum dot emission film is performed to measure a COO— peak intensity relative to a Si peak, and the result is shown in Table 1 and FIG. 5.

Reference Example 3-3

The octane dispersion of core/shell quantum dots according to Reference Example 1 (100 to 200 ul) is spin-coated on a silicon substrate and heat-treated at 80° C. for 30 minutes to form a 24 nm-thick quantum dot emission film. The quantum dot emission film is spin-dry treated. An infrared spectrum of the treated quantum dot emission film is performed to measure a COO— peak intensity relative to a Si peak, and the result is shown in Table 1 and FIG. 5.

TABLE 1

| Example | COO/Si peak intensity | Film thickness (nm) | OA decrease rate |
|---|---|---|---|
| Reference Example 3-2 | 0.74 | 21 | 52% |
| Reference Example 3-1 | 1.53 | 27 | reference |
| Reference Example 3-3 | 1.01 | 24 | 34% |

Figure 5:
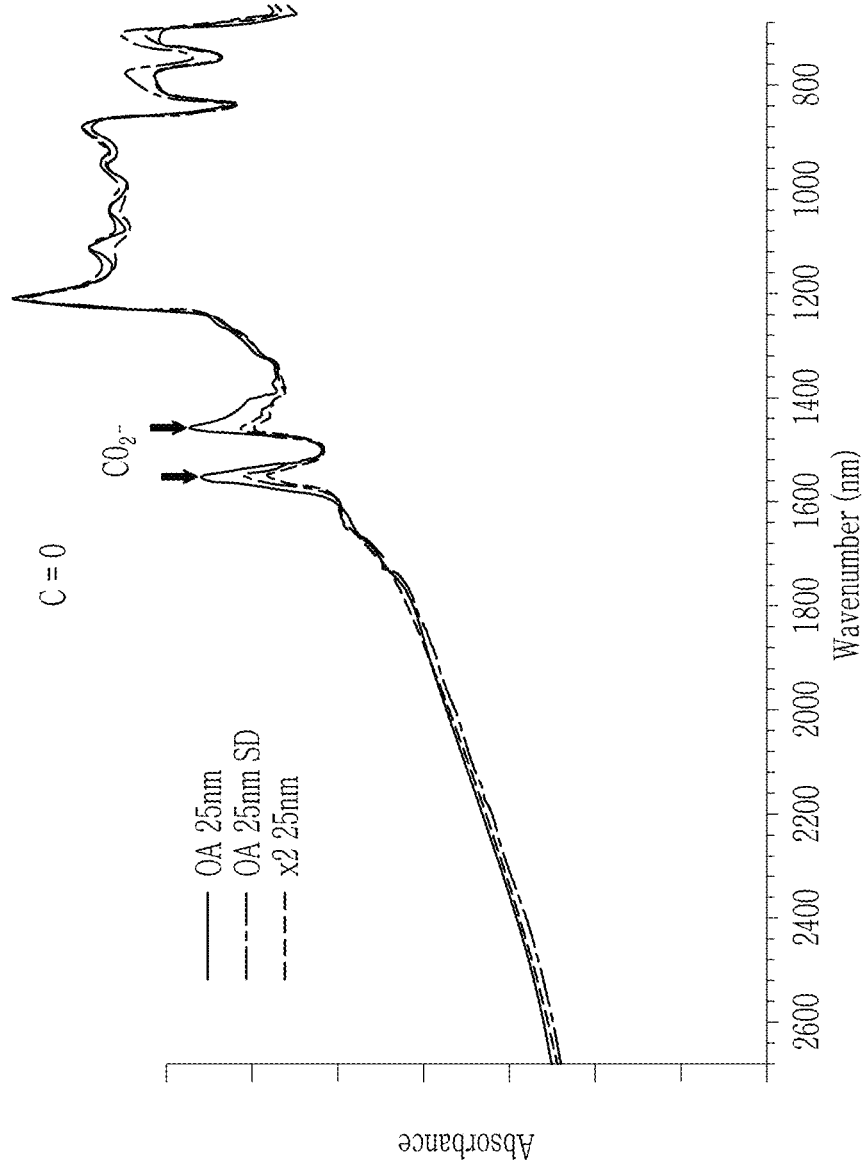
FIG. 5 shows infrared spectroscopy spectra with arbitrary absorbance units of the quantum dot emission films produced in Reference Examples 3-1 to 3-3.

Referring to the results of Table 1 and FIG. 5, the amount of organic ligands bound to quantum dots is shown to greatly decrease through the spin-dry treatment process, and accordingly, chloride (Cl—) instead of COO— may be bound to the quantum dots of the quantum dot thin films. In addition, the observed decrease in the amount of the organic ligands bound to quantum dots is greater in Reference Example 3-2 where a similar thickness is formed, but instead, in a multi-layered method (layer by layer).

Reference Example 4-1

A quantum dot emission film is formed according to the same method as Reference Example 3-1 except that the film thickness is changed into about 38 nm by adjusting optical density of the octane dispersion of core/shell quantum dots (100 to 200 ul) and the rotation speed of the spin coater. An infrared spectrum of the obtained quantum dot emission film is obtained to measure a COO— peak intensity relative to a Si peak, and the result is shown in Table 2 and FIG. 6.

Reference Example 4-2

A quantum dot emission film is formed according to the same method as Reference Example 3-2 except that the film thickness is changed to about 34 nm by forming a single layer and four times repeating the spin-dry treatment. An infrared spectrum of the obtained quantum dot emission film is used to measure a COO— peak intensity relative to a Si peak, and the result is shown in Table 2 and FIG. 6.

Reference Example 4-3

A quantum dot emission film is formed according to the same method as Reference Example 3-3 except that the film thickness is changed to about 33 nm by adjusting optical density of the octane dispersion of core/shell quantum dots (100 to 200 ul) and a rotation speed of the spin coater. An infrared spectrum of the treated quantum dot emission film is obtained to measure a COO— peak intensity relative to a Si peak, and the result is shown in Table 2 and FIG. 6.

TABLE 2

|  | COO/Si peak intensity | Film thickness (nm) | OA decrease rate |
|---|---|---|---|
| Reference Example 4-2 | 1.12 | 34 | 50% |
| Reference Example 4-1 | 2.26 | 38 | reference |
| Reference Example 4-3 | 1.43 | 33 | 37% |

Figure 6:
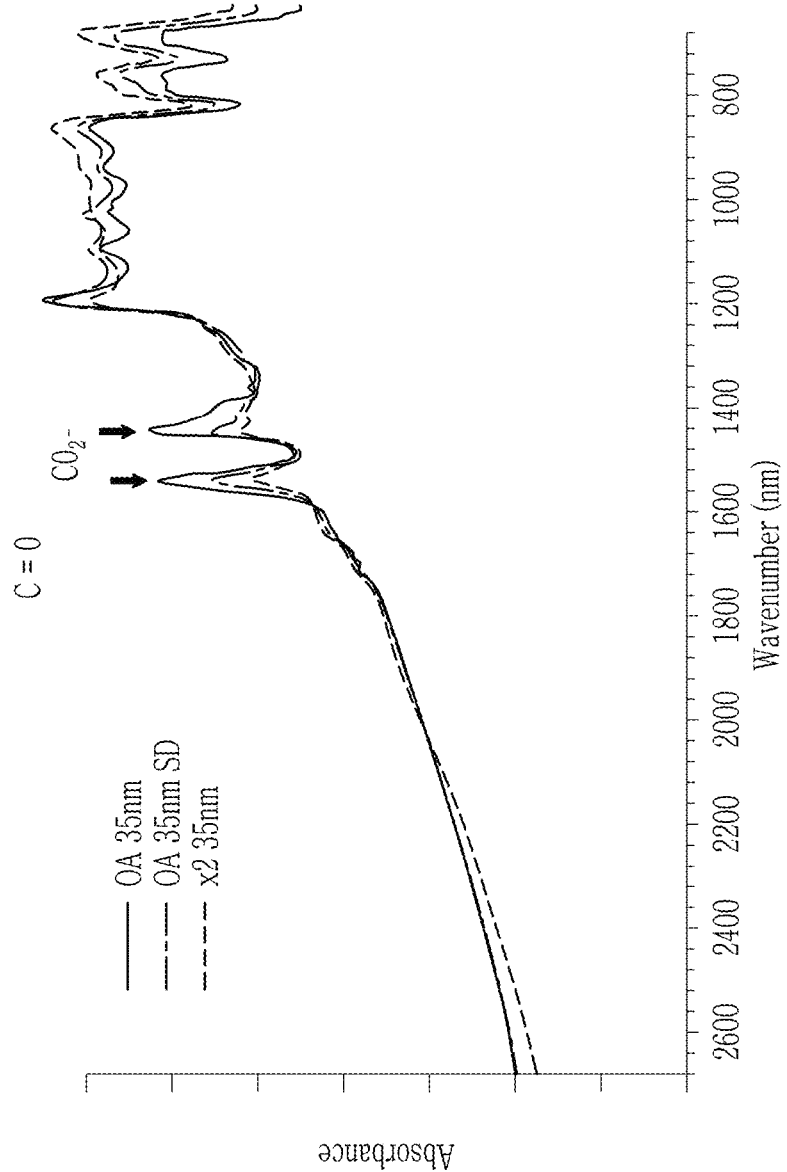
FIG. 6 shows infrared spectroscopy spectra with arbitrary absorbance units of the quantum dot emission films produced in Reference Examples 4-1 to 4-3.
Figure 7:
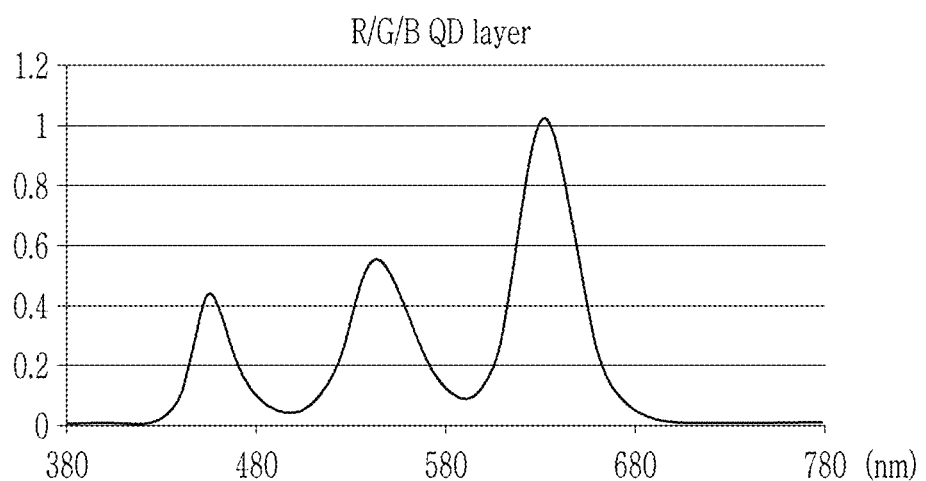
FIG. 7 shows an electroluminescence spectrum of the light emitting device produced in Example 3.
Figure 8:
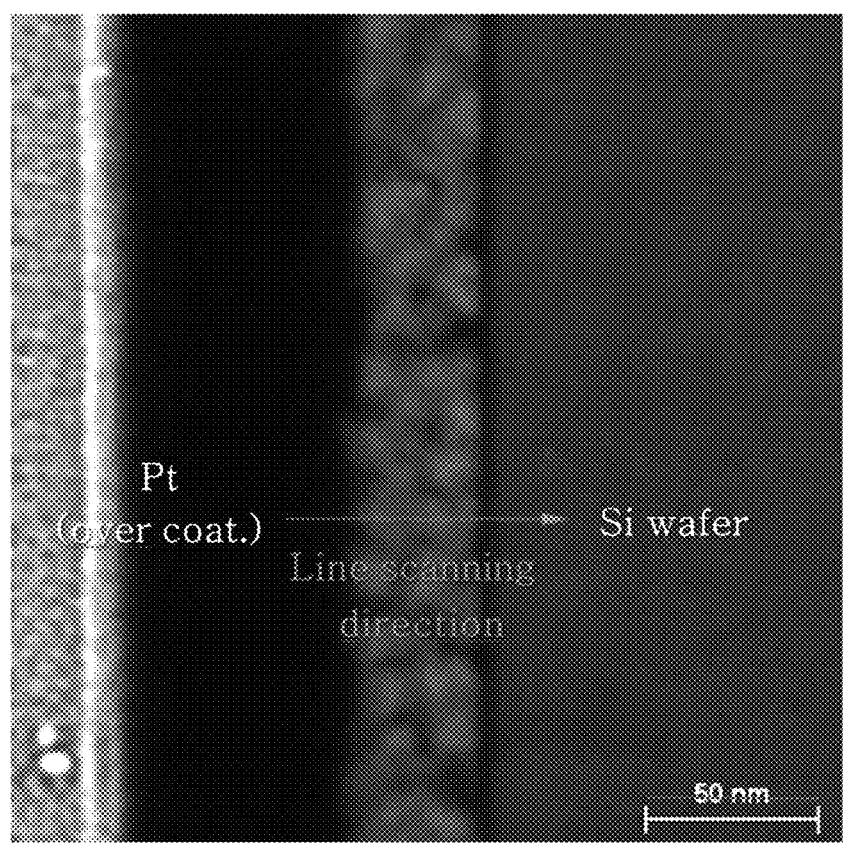
FIG. 8 shows a cross-section of the specimen for TEM-EDX line scanning analysis in Experimental Example 3.

Referring to the results of Table 2 and FIG. 6, the amount of organic ligands bound to the quantum dots is shown to decrease through the spin-dry treatment, which suggests that chloride (Cl—) instead of COO— may be bound to the quantum dots of the quantum dot thin films.

Manufacture of Light Emitting Device

Example 1

A device having a laminate structure of ITO/PEDOT:PSS (30 nm)/TFB (25 nm)/Blue quantum dot emission film/ ZnMgO (40 nm)/Al (1000 nm) is manufactured as follows.

[1] An ITO-deposited glass substrate is surface-treated with UV-ozone for 15 minutes, spin-coated with a PEDOT: PSS solution (H. C. Starks) and heated at 150° C. for 10 minutes in air, and followed by a second heating at 150° C. for 10 minutes under a $N_2$ atmosphere to provide a hole injection layer having a thickness of 30 nm. A poly[(9,9-dioctylfluorenyl-2,7-diyl-co(4,4'-(N-4-butylphenyl)diphenylamine] solution (TFB) (Sumitomo) is spin-coated on the hole injection layer and heat-treated at 150° C. for 30 minutes to form a hole transport layer having a thickness of 25 nm.

[2] On the hole transport layer (HTL), the core/shell quantum dot dispersion according to Reference Example 1 is used to form a single layer having a target thickness of 11 nm. The single layer is spin-dry treated three times according to the method of Reference Example 3-1, to provide a quantum dot emission film having a final thickness of 25 nm.

[3] A solution of the ZnMgO nanoparticles prepared in Reference Example 2 (a solvent: ethanol, optical density: 0.5 arbitrary unit (a.u.)) is prepared. The solution is spin-coated on the quantum dot emission film and heat-treated at 80° C. for 30 minutes to form an electron auxiliary layer having a thickness of 40 nm. On a part of the surface of the electron auxiliary layer, aluminum (Al, 90 nm) is vacuum-deposited to form a second electrode to manufacture a light emitting device represented in FIG. 1.

Electroluminescent properties and life-span characteristics of the obtained light emitting device are evaluated using a Keithley 2200 source measuring device and a Minolta CS2000 spectroradiometer (current-voltage-luminance measurement equipment) and the results are shown in Table 3.

Example 2

A light emitting device is manufactured according to the same method as Example 1 except that a target thickness of a single layer is 11 nm and a quantum dot emission film having a final thickness of 42 nm is formed by performing the spin-dry treatment five times according to the method as Reference Example 3-1.

Electroluminescent properties and life-span characteristics of the obtained light emitting device are evaluated using a Keithley 2200 source measuring device and a Minolta CS2000 spectroradiometer (current-voltage-luminance measurement equipment) and results are shown in Table 3.

Comparative Example 1

A light emitting device is manufactured according to the method as Example 1 except that a quantum dot emission film having a final thickness of 24 nm is formed according to the method as Reference Example 3-2, and by using a core/shell quantum dot dispersion according to Reference Example 1 on the hole transport layer (HTL).

Electroluminescent properties and life-span characteristics of the obtained light emitting device are evaluated using a Keithley 2200 source measuring device and a Minolta CS2000 spectroradiometer (current-voltage-luminance measurement equipment) and results are shown in Table 3.

Comparative Example 2

A light emitting device is manufactured according to the same method as Example 1 except that a quantum dot emission film having a final thickness of 35 nm is formed according to the method as Reference Example 3-3 by using the core/shell quantum dot dispersion according to Reference Example 1 on the hole transport layer (HTL).

Electroluminescent properties and life-span characteristics of the obtained light emitting device are evaluated using a Keithley 2200 source measuring device and a Minolta CS2000 spectroradiometer (current-voltage-luminance measurement equipment) and results are shown in Table 3.

TABLE 3

|  | T50 (h) | Max EQE. | Max Lumi. |
|---|---|---|---|
| Comparative Example 1 | 3.5 h | 2.7 | 7780 |
| Comparative Example 2 | 13 h | 4.2 | 7210 |
| Example 1 | 23 h | 4.0 | 9030 |
| Example 2 | 69 h | 6.4 | 10560 |

As indicated by the data of Table 3, when a constant current with 325 nits is applied to each light emitting device, T50 (h) is defined as time (hours) taken for luminance to decrease to 50% relative to an initial luminance of 100%. Referring to Table 3, the light emitting devices according to Examples 1 and 2 show improved life-span characteristics and improved electro-luminescence. The device of Example 2 exhibits at least a 400% increase in lifetime, at least a 30% improvement in quantum efficiency, and at least a 46% increase in maximum luminescence, than that of the device of Comparative Example 2.

Example 3

A light emitting device is manufactured according to the same method as Example 1 except that an RBG quantum dot emission film is formed by using the red light emitting quantum dot according to Reference Example 1-2 to form a single layer having a target thickness of 11 nm and by using a single spin-dry treatment according to the method as Reference Example 3-1. A single layer of blue light emitting quantum dot according to Reference Example 1-1 is formed having a target thickness of 11 nm and two spin-dry treatments according to the method as Reference Example 3-1. A single layer of green light emitting quantum dot according to Reference Example 1-2 is formed on the blue light emitting quantum dot single layer having a target thickness of 11 nm with a single spin-dry treatment according to the method as Reference Example 3-1.

A laminate structure of the light emitting device is ITO/PEDOT:PSS/TFB/(4 spin-dried layers of R/B/B/G)/ZnMgO/Al.

Electroluminescence spectra of the produced light emitting device are obtained using a Keithley 2200 source measuring device and a Minolta CS2000 spectroradiometer (current-voltage-luminance measurement equipment).

Experimental Example 1: HOD (Hole Only Device) Manufacture and HT Measurement Using the Same HOD having a structure of PEDOT/TFB/QD/GSH0137:L101 (360 Å:100 Å)/Ag 1000 Å is manufactured. An ITO patterned substrate is subjected to an ultraviolet (UV)-ozone (UVO)-surface treatment. A hole injection layer (e.g., a PEDOT:PSS layer) is spin-coated to have a thickness of about 30 nm, and then, heat-treated to remove residual organic materials. On the hole injection layer, a TFB layer is spin-coated to have a thickness of about nm, and then heat-treated to remove residual organic materials. On the TFB layer, a quantum dot emission layer (thickness: 38 nm) is formed by the following methods listed in Table 4. An upper hole transport layer, a GSH0137:L101 is sequentially thermally deposited in thicknesses of 36 nm/10 nm on the quantum dot emission layer. Under a mask, silver (Ag) is thermally deposited to form an electrode. The device is sealed with a sealing resin/glass. Hole transport capability of the manufactured HOD is evaluated by measuring a current depending on a voltage by using a Keithley 2635B source meter, while the voltage is applied thereto.

TABLE 4

| Device | Method of forming an emission layer | $3^{rd}$ sweep, Current at 8 V |
|---|---|---|
| 1 | Similar method to Reference Example 3-1 | 0.09 |
| 2 | According to Reference Example 3-2, four times spin-dry treatment | 60.16 |
| 3 | Similar method to Reference Example 3-3 | 8 |

Referring to the results of Table 4, the spin dry treatment greatly increases hole conductivity (HT), and accordingly, a light emitting device including a plurality of layers formed with more than one spin dry treatment exhibits greatly improved HT compared with a device having an emission layer formed with a single spin-dry treatment.

Experimental Example 2: ICP Analysis

A quantum dot emission film is formed according to a method similar to that of Reference Example 3-1 (OA), Reference Example 3-2 (LBL), and Reference Example 3-3 (SD). An ICP analysis of the three quantum dot emission films is conducted and the results summarized in Table 5.

TABLE 5

|  |  | Molar ratio | | |
|---|---|---|---|---|
| Emission Film | Thickness | Zn | Se | Zn/Se |
| OA | 33 nm | 0.649 | 0.351 | 1.849 |
| SD | 30 nm | 0.652 | 0.348 | 1.874 |
| LBL | 28 nm | 0.662 | 0.338 | 1.959 |

Referring to the results of Table 5, an emission film including a plurality of emission layers having the spin-dry treatment according to Reference Example 3-2 is shown to have a relatively high amount of a metal (zinc) relative to that of chalcogenide compared with an emission film having no spin-dry treatment.

Experimental Example 3: IC Analysis 30 nm-thick quantum dot emission films are respectively formed according to a method similar to that of Reference Example 3-2 (LBL) and Reference Example 3-3 (SD). An IC analyses of the emission films was performed. A 45 mm×25 mm-sized sample is used as an extraction sample with 2 ml of a solvent. The results are shown in Table 6.

TABLE 6

| Emission Film | Cl (ppm) |
|---|---|
| SD | 1.201 |
| LBL | 1.596 |

Referring to the results of Table 6, the spin-dry treated quantum dot emission film includes chlorine.

Experimental Example 4: TEM EDX Cross-section Analysis

A 45 nm-thick quantum dot emission film is formed on a Si wafer according to a similar method to that of Reference Example 3-1 (OA), Reference Example 3-2 (LBL), and Reference Example 3-3 (SD), and a cross-sectional sample for each of the emission films is prepared. Referring to FIG.

Figure 9:
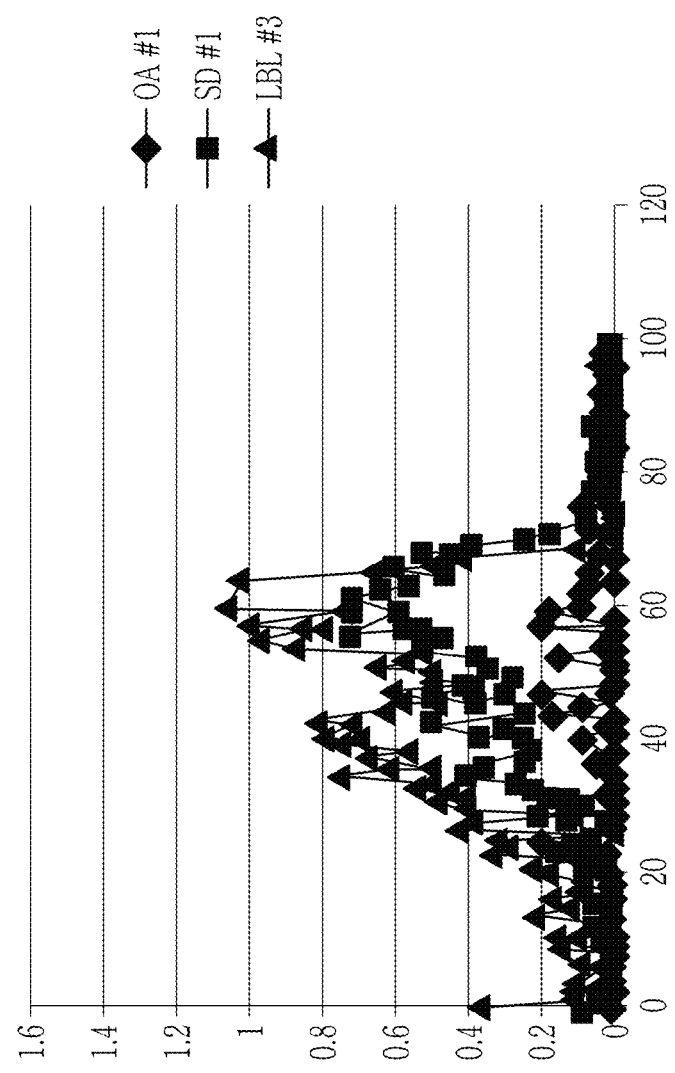
FIG. 9 shows a TEM-EDX line scanning analysis result in Experimental Example 3.

8, a TEM-EDX analysis is performed on the cross-sectioned films, and the results are shown in FIG. 9.

Referring to the results of FIG. 9, as for the OA sample Cl— is nearly absent, but as for the SD and LBL samples, a Cl-distribution is present. As shown, a detection of the Cl— peak is a little stronger detected in the LBL sample than in the spin dry sample.

Experimental Example 5: XPS Analysis

Figure 10:
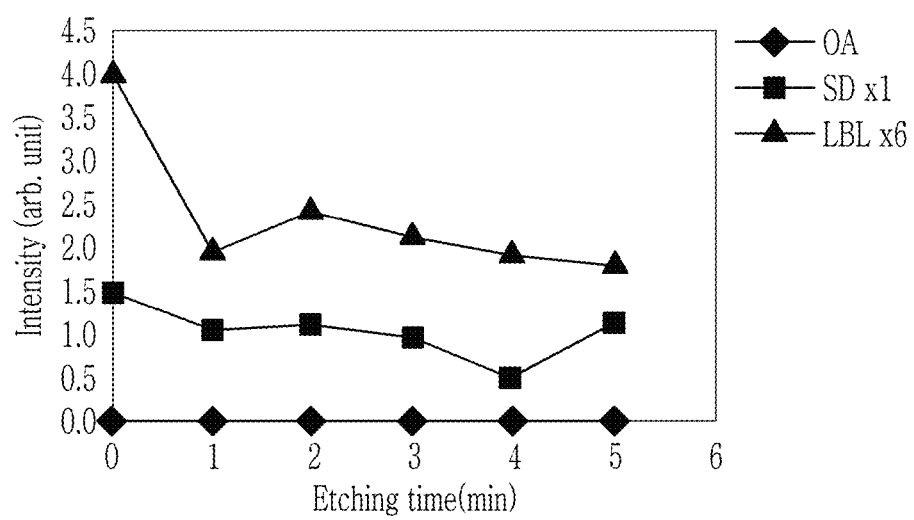
FIG. 10 shows an XPS analysis result of Experimental Example 4.

A 45 nm-thick quantum dot emission film is formed on a Si wafer according to a method similar to that of Reference Example 3-1 (OA), Reference Example 3-2 (LBL), and Reference Example 3-3 (SD). An XPS depth profile analysis is performed as the emission film is etched at one-minute intervals. The results are shown in Table 7 and FIG. 10. Referring to the results of FIG. 10, the LBL sample shows the highest CI signal on the surface before the etching, and in addition, a little higher CI signal inside than the SD sample. Accordingly, the LBL emission film has a more uniform distribution than that of the SD emission film.

TABLE 7

| Etching time (min) | OA 45 nm | | Spin dry 45 nm | | LBL 45 nm | |
|---|---|---|---|---|---|---|
| | Cl2p** | Zn2p3 | Cl2p | Zn2p3 | Cl2p | Zn2p3 |
| 0 | 0.0 | 26.1 | 1.5 | 25.7 | 4.0 | 35.3 |
| 1 | 0.0 | 54.7 | 1.1 | 54.1 | 2.0 | 50.6 |
| 2 | 0.0 | 55.7 | 1.1 | 55.1 | 2.4 | 54.4 |
| 3 | 0.0 | 57.6 | 0.9 | 57.1 | 2.2 | 55.3 |
| 4 | 0.0 | 58.2 | 0.5 | 57.9 | 2.0 | 56.1 |
| 5 | 0.0 | 61.0 | 1.1 | 60.3 | 1.8 | 57.9 |

While this disclosure has been described in a connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: first electrode
12, 20: hole auxiliary layer
13, 30: emission layer
14, 40: electron auxiliary layer
15, 50: second electrode
100 substrate
10 anode

What is claimed is:

1. A quantum dot emission film comprising a first surface and an opposite second surface;
   wherein the quantum dot emission film comprises a first emission layer comprising first quantum dots that constitute at least a portion of the first surface, and a second emission layer comprising second quantum dots that constitute at least a portion of the second surface,
   wherein the first quantum dots and the second quantum dots do not include lead, and
   the first quantum dots and the second quantum dots comprise a halide on at least a portion of the surface of the quantum dots,
   wherein an amount of the halide in the quantum dot emission film is greater than or equal to about 0.01 parts per million and less than or equal to about 0.5 parts per million based on a light emitting surface of 1 square centimeter as determined by ion chromatograph.

2. The emission film of claim 1, wherein the emission film does not comprise cadmium.

3. The emission film of claim 1, wherein the first quantum dots and the second quantum dots do not include an organic thiol compound on the surfaces of the quantum dots.

4. The emission film of claim 1, wherein the first and the second quantum dots comprise zinc, and wherein a ratio of zinc peak intensity relative to a halide peak intensity in the emission film is greater than or equal to about 3%, as determined by X-ray photoelectron spectroscopy.

5. The emission film of claim 1, wherein the first quantum dots and the second quantum dots emit identical color light to each other.

6. The emission film of claim 1, wherein the first quantum dots and the second quantum dots emit different color light from each other.

7. The emission film of claim 1, wherein the first quantum dots and the second quantum dots comprise a core, and a shell disposed on the core.

8. The emission film of claim 7, wherein the core comprises a first semiconductor nanocrystal, and the shell comprises a second semiconductor nanocrystal having a different composition than the first semiconductor nanocrystal, and
   the first semiconductor nanocrystal and the second semiconductor nanocrystal independently comprise a Group II-VI compound, a Group III-V compound, a Group IV-VI compound, a Group IV element or compound, a Group I-III-VI compound, a Group I-II-IV-VI compound, or a combination thereof.

9. The emission film of claim 8, wherein the first semiconductor nanocrystal comprises InP, InZnP, ZnSe, ZnSeTe, or a combination thereof.

10. The emission film of claim 7, wherein an outermost layer of the shell comprises zinc and sulfur.

11. The emission film of claim 1, wherein the first quantum dots and the second quantum dots further comprise an organic ligand on the surfaces thereof, and the organic ligand comprises RCOOH, RNH$_2$, R$_2$NH, R$_3$N, RH$_2$PO, R$_2$HPO, R$_3$PO, RH$_2$P, R$_2$HP, R$_3$P, ROH, RCOOR, RPO(OH)$_2$, RHPOOH, R$_2$POOH, or a combination thereof, wherein R is the same or different and independently comprises a C1 to C40 substituted or unsubstituted aliphatic hydrocarbon, or a C6 to C20 substituted or unsubstituted aromatic hydrocarbon, or a combination thereof.

12. The emission film of claim 11, wherein the organic ligand comprises a C6 to C40 aliphatic carboxylic acid compound.

13. The emission film of claim 1, wherein the emission film has a thickness of greater than or equal to about 10 nanometers.

14. The emission film of claim 1, wherein the emission film has a thickness of greater than or equal to about 30 nanometers.

15. The emission film of claim 1, wherein the first emission layer has a thickness of greater than or equal to about 5 nanometers, and the second emission layer has a thickness of greater than or equal to about 5 nanometers.

16. The emission film of claim 1, wherein the emission film further comprises a third emission layer having a third surface disposed between the first emission layer and the second emission layer and comprising third quantum dots,
   wherein the third quantum dots that constitute at least a portion of the third surface comprise a halide on at least a portion of their surfaces.

17. The emission film of claim 16, wherein the third quantum dots emit the same color light as the first quantum dots and the second quantum dots.

18. The emission film of claim 16, wherein the third quantum dots emit a different color light from the first quantum dots and the second quantum dots.

19. The emission film of claim 16, wherein the third emission layer has a thickness of greater than or equal to about 5 nanometers and less than or equal to about 40 nanometers.

* * * * *